(12) United States Patent
Ko

(10) Patent No.: US 7,564,056 B2
(45) Date of Patent: Jul. 21, 2009

(54) METHOD FOR MANUFACTURING A SEMICONDUCTOR DEVICE

(75) Inventor: Young Suk Ko, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 125 days.

(21) Appl. No.: 11/616,282

(22) Filed: Dec. 26, 2006

(65) Prior Publication Data

US 2007/0158650 A1 Jul. 12, 2007

(30) Foreign Application Priority Data

Dec. 29, 2005 (KR) .................. 10-2005-0133465

(51) Int. Cl.
*H01L 21/00* (2006.01)
*H01L 21/336* (2006.01)
*H01L 29/04* (2006.01)
*H01L 31/036* (2006.01)

(52) U.S. Cl. .................. 257/57; 438/297; 438/301; 438/306

(58) Field of Classification Search .................. 438/386, 438/244, 393, 286, 294, 297, 296, 298, 301, 438/303, 305, 306, 439, 149; 257/57
See application file for complete search history.

(56) References Cited

U.S. PATENT DOCUMENTS 5,828,103 A * 10/1998 Hsu .......................... 257/344

* cited by examiner

*Primary Examiner*—Chuong Anh Luu
(74) *Attorney, Agent, or Firm*—Sherr & Vaughn, PLLC

(57) ABSTRACT

Embodiments relate to a method for manufacturing a semiconductor device. In embodiments, the method may include forming a gate electrode on the semiconductor substrate, forming a pattern having a groove at the edge of the gate electrode and performing an etching process using the pattern as a mask, so that a groove extending from the edge of the gate electrode to LDD is formed, forming an ion diffusion barrier on the substrate having the gate electrode and the groove obtained through the previous step, implanting low-density ions onto the diffusion barrier, forming a spacer at edge of the gate electrode, and implanting high-density ions onto the substrate using the spacer and the gate electrode. A problem that may be caused by ion-implantation or diffusion process may be solved so that the hot carrier effects are improved, thereby improving the reliability of the semiconductor device.

14 Claims, 3 Drawing Sheets

METHOD FOR MANUFACTURING A SEMICONDUCTOR DEVICE

The present application claims priority under 35 U.S.C. 119 and 35 U.S.C. 365 to Korean Patent Application No. 10-2005-0133465 (filed on Dec. 29, 2005), which is hereby incorporated by reference in its entirety.

BACKGROUND

As semiconductor devices become more highly integrated, a transistor may be formed with a line width having a micro-size. In this regard, "hot carrier effects" may occur in the transistor.

Hot carrier effects may include a phenomenon in which a horizontal electric field is largely concentrated on a drain area when a length of a channel is short. Accordingly, electrical characteristics of a drain area may be degraded and holes may be discharged toward a substrate.

In addition, electrons may be trapped at lower portions of a gate oxide layer or a spacer. This may have an effect upon a threshold voltage.

Such hot carrier effects may occur when a high electric field is applied to the substrate even though a supply voltage may be low. This may be because a channel may have a short length due to the micro-size of the semiconductor device. In particular, this phenomenon may occur when the length of the channel, which may be a path of carriers, between a source area and a drain area is short.

To overcome the hot carrier effect, a transistor may use an LDD (Lightly Doped Drain) structure. On a semiconductor substrate, source/drain areas may be aligned on the substrate having a gate electrode between them. For an LDD structure, ion-implantation density of the source/drain areas may be low at an area in the vicinity of an edge of the gate electrode, and may be high at an area remote from the edge of the gate electrode. Such a layout may be a graded junction, and may reduce a sudden change of an electric field.

Hot carrier effects may be ameliorated or controlled by the LDD structure. As shown in FIG. 1, however, $N^-$ ions implanted into lower portions of side wall spacers that may be formed at the gate electrode may cause a problem if ion-implantation or ion-diffusion is performed relative to the drain or the source. In this case, a performance of the semiconductor device may still be degraded by the hot carrier effects.

SUMMARY

Embodiments relate to a method for manufacturing a semiconductor device. Embodiments relate to a method for manufacturing a semiconductor device that may be capable of restricting hot carrier effects and may improve a performance of a transistor, thereby stably operating the semiconductor device.

Embodiments relate to a semiconductor device that may be capable of improving hot carrier effects by forming an oxide groove between a lower portion of a gate and a drain area such that an acceleration of electrons may be reduced due to a weak electric field of the drain area when electrons are injected from a source area to the drain area.

In embodiments, a method for manufacturing a semiconductor device may include (a) forming a gate electrode on a semiconductor substrate; (b) forming a pattern having a groove at a lateral side of the gate electrode, and performing an etching process using the pattern as a mask, thereby forming a groove extending from the lateral side of the gate electrode to an LDD; (c) forming an ion-diffusion barrier on the substrate having the gate electrode and the groove obtained through step (b); (d) implanting low-density ions onto the ion-diffusion barrier; (e) forming a spacer at the lateral side of the gate electrode; and (f) implanting high-density ions onto the substrate using the spacer and the gate electrode.

In embodiments, the lateral side of the gate electrode includes one of a source area, a drain area, and a source-drain area, and a plurality of grooves may be formed.

In embodiments, the ion-diffusion barrier includes an oxide layer or a nitride layer.

DETAILED DESCRIPTION OF EMBODIMENTS

Figure 1:
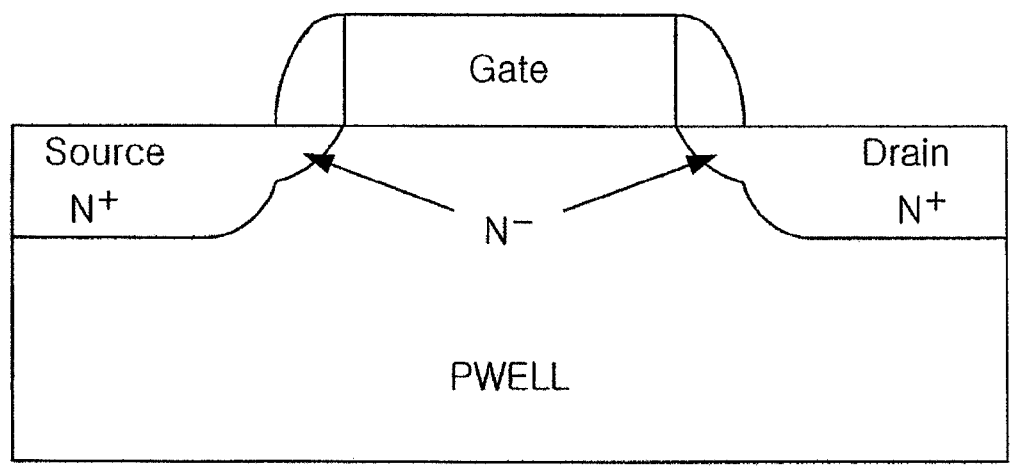
FIG. 1 is an example sectional diagram illustrating a related art gate MOSFET device.
Figure 2A:
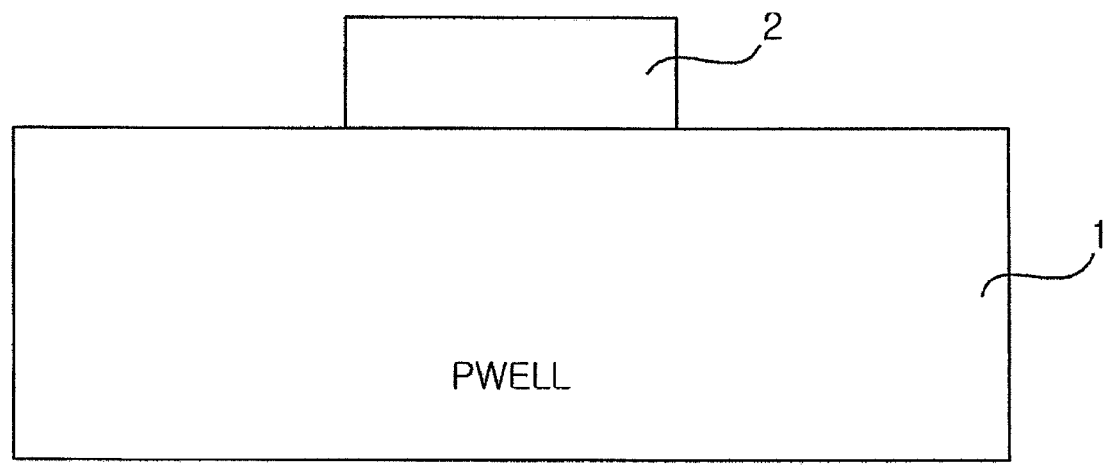
FIG. 2a to FIG. 2e are example sectional diagrams illustrating a semiconductor device and a method for manufacturing a semiconductor device according to embodiments.

As shown in FIG. 2a, gate electrode 2 may be formed on semiconductor substrate 1.

To form gate electrode 2, polysilicon and photoresist may be sequentially deposited on substrate 1. A photo process and an etching process may then be performed on the photoresist to form a gate electrode pattern.

An etching process may be performed, for example using the gate electrode pattern. Gate electrode 2 may thereby be formed.

After the etching process, a cleaning process may be performed and may remove any remaining photoresist.

Figure 2B:
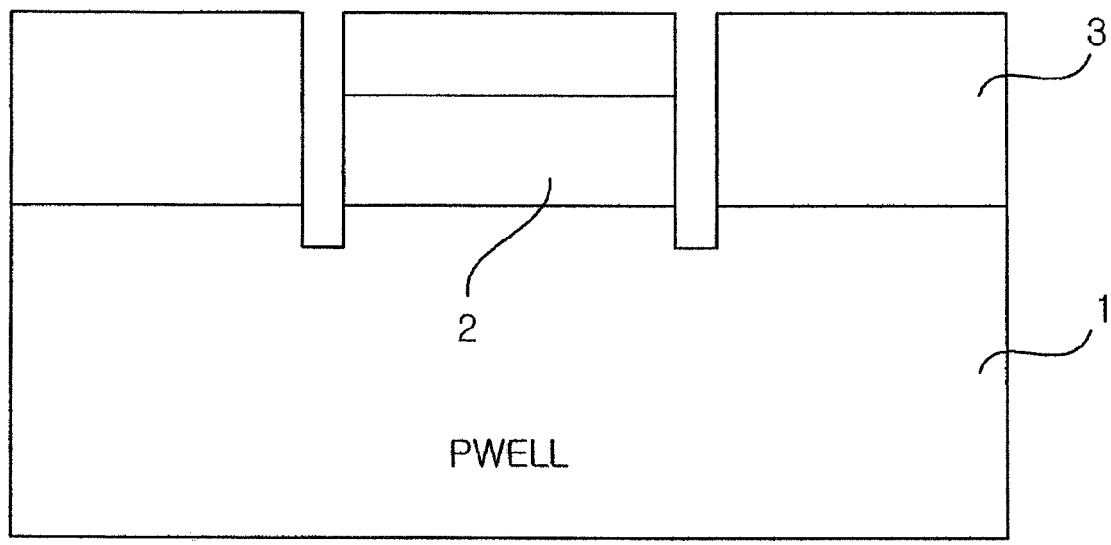

Referring to FIG. 2b, photoresist 3 may be coated on gate electrode 2. A photo process and an etching process may be performed on photoresist 3. A pattern having a groove may be formed at both sides of gate electrode 2.

The groove may have a depth sufficient to expose a surface of substrate 1. Exposed semiconductor substrate 1 may then be etched, for example using the pattern as a mask. A groove extending from the lateral side of gate electrode 2 to a PWELL may thus be formed. A cleaning process may then be performed and may remove remaining photoresist 3.

Figure 2C:
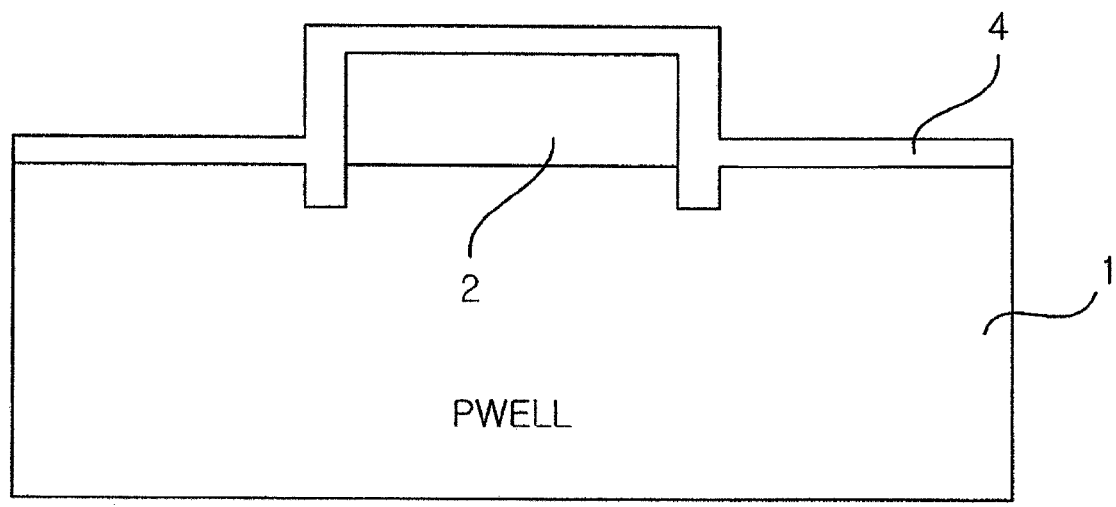

Referring to FIG. 2C, oxide layer 4 may be formed on substrate 1 having the groove. Oxide layer 4 may serve as a buffer layer, and may protect semiconductor substrate 1 in an ion-implantation process. Oxide layer 4 may also prevent diffusion caused by the ion-implantation.

In embodiments, oxide layer 4 may be removed after the ion-implantation process.

Figure 2D:
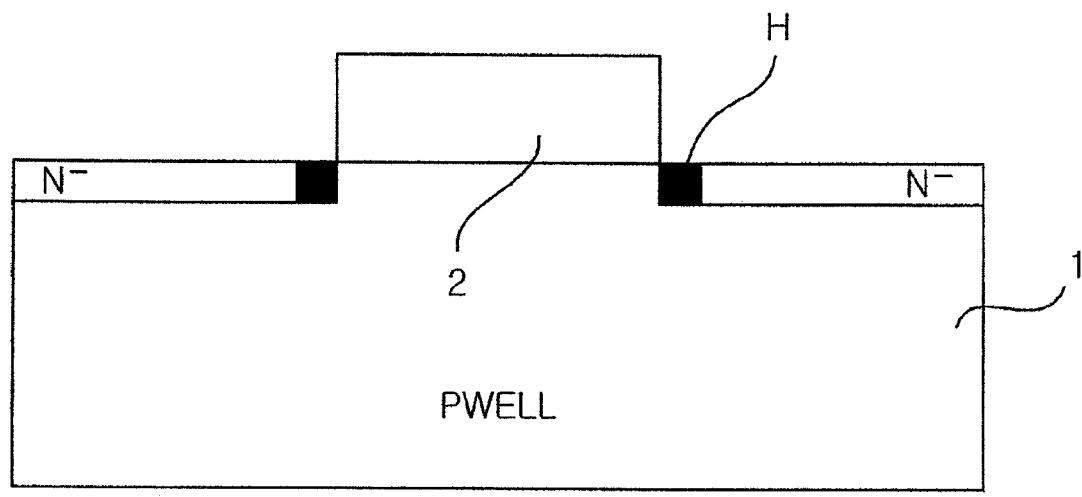

Referring to FIG. 2d, $N^-$ ions may be implanted.

Figure 2E:
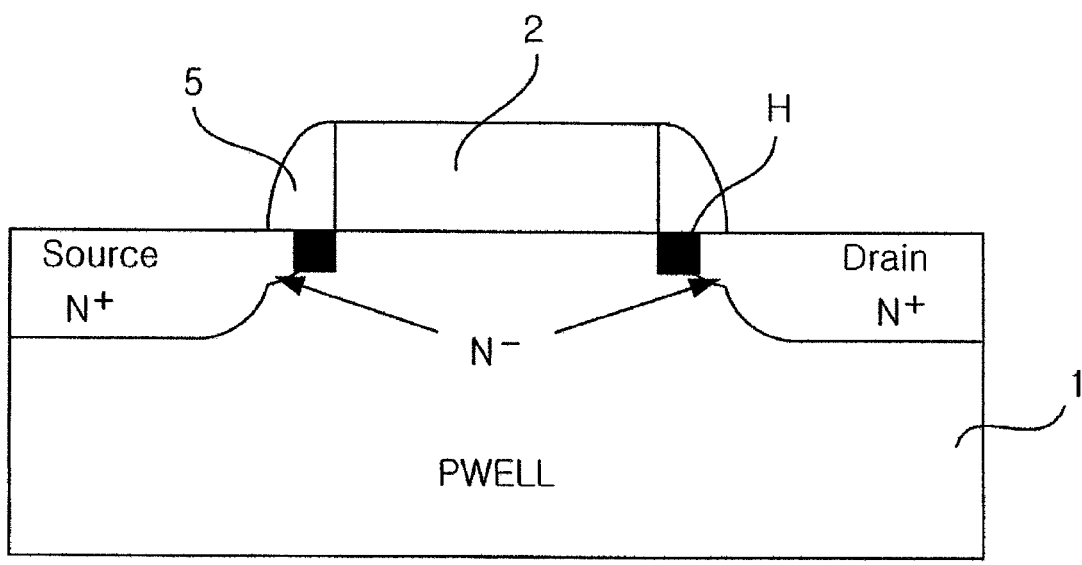

Referring to FIG. 2e, spacer 5 may be formed at the lateral side of gate electrode 2 and $N^+$ ions may be implanted. A source and a drain area may thus be formed.

In embodiments, ion-implantation may be performed using spacer 5 and gate electrode 2 as a mask. The ion-implantation energy for forming the source/drain area may be within a range of approximately 30 keV to 80 keV.

In embodiments, acceleration of electrons may be weakened due to a weak electric field of the drain when electrons are injected from a source to a drain through the groove H that may be formed between the lower portion of the gate and the drain. Hot carrier effects may thereby be improved.

Although embodiments have been described having an oxide layer formed on the source/drain area, it may also be possible to form the oxide only in the drain area. In addition, although only one oxide layer is described, in embodiments a number of oxide layers may be changed.

According to embodiments, the detrimental hot carrier effects may be reduced, and a reliability of the semiconductor device may be improved.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a gate electrode over a semiconductor substrate;
   forming a pattern over the semiconductor substrate having an opening adjacent to at least one lateral side of the gate electrode;
   etching the semiconductor substrate using the pattern as a mask to form a groove in the semiconductor substrate extending from the at least one lateral side of the gate electrode to an LDD region;
   forming an ion-diffusion barrier over the substrate, including over the gate electrode and in the groove;
   implanting low-density ions onto the ion-diffusion barrier;
   forming a spacer at both lateral sides of the gate electrode; and
   implanting high-density ions onto the substrate using the spacer and the gate electrode as a mask.

2. The method of claim 1, wherein the groove is formed only in a drain region of the semiconductor substrate.

3. The method of claim 1, wherein the groove is formed in a drain region and a source region of the semiconductor substrate.

4. The method of claim 1, wherein the lateral side of the gate electrode includes at least one of a source area, a drain area, and a source-drain area.

5. The method of claim 1, wherein a plurality of grooves are formed.

6. The method of claim 1, wherein the ion-diffusion barrier comprises at least one of an oxide layer and a nitride layer.

7. The method of claim 1, wherein an ion-implantation energy for implanting high-density ions onto the substrate is in a range of 30 keV to 80 keV.

8. The method of claim 5, wherein implanting high-density ions onto the substrate forms the source/drain areas.

9. The method of claim 1, further comprising removing the ion-diffusion barrier prior to form in the spacers.

10. A method comprising:
    forming at least one groove in a semiconductor substrate extending from a side of a gate electrode to an LDD region;
    forming an ion-diffusion barrier over the substrate, including over the gate electrode and in the groove;
    implanting low-density ions onto the ion-diffusion barrier;
    forming spacers at lateral sides of the gate electrode over the at least one groove; and
    implanting high-density ions onto the substrate using the spacer and the gate electrode as a mask.

11. The method of claim 10, wherein the at least one groove is formed only in a drain region of the semiconductor substrate.

12. The method of claim 10, wherein the at least one groove is formed in a drain region and a source region of the semiconductor substrate.

13. The method of claim 10, comprising two groove formed in the semiconductor substrate on either side of a gate, wherein a spacer is formed over each groove, respectively.

14. The method of claim 10, wherein the ion-diffusion barrier comprises at least one of an oxide layer and a nitride layer.

* * * * *